United States Patent
Wintermantel

(10) Patent No.: US 12,261,349 B2
(45) Date of Patent: Mar. 25, 2025

(54) RADAR SYSTEM FOR DETECTING SURROUNDINGS, COMPRISING A WAVEGUIDE ANTENNA MADE OF A PRINTED CIRCUIT BOARD AND A MOLDED PART

(71) Applicant: Continental Autonomous Mobility Germany GmbH, Ingolstadt (DE)

(72) Inventor: Markus Wintermantel, Lindau (DE)

(73) Assignee: Continental Autonomous Mobility Germany GmbH, Ingolstadt (DE)

( * ) Notice: Subject to any disclaimer, the term of this patent is extended or adjusted under 35 U.S.C. 154(b) by 209 days.

(21) Appl. No.: 18/043,650

(22) PCT Filed: Aug. 16, 2021

(86) PCT No.: PCT/DE2021/200111
§ 371 (c)(1),
(2) Date: Mar. 1, 2023

(87) PCT Pub. No.: WO2022/053114
PCT Pub. Date: Mar. 17, 2022

(65) Prior Publication Data
US 2023/0275336 A1 Aug. 31, 2023

(30) Foreign Application Priority Data
Sep. 8, 2020 (DE) .................. 10 2020 211 254.1

(51) Int. Cl.
*H01Q 1/22* (2006.01)
*G01S 7/03* (2006.01)
(Continued)

(52) U.S. Cl.
CPC .......... *H01Q 1/2283* (2013.01); *G01S 7/032* (2013.01); *G01S 13/931* (2013.01); *H01P 5/107* (2013.01); *H01Q 1/3233* (2013.01)

(58) Field of Classification Search
CPC .... H01Q 1/2283; H01Q 1/3233; H01P 5/107; G01S 7/032; G01S 13/931
See application file for complete search history.

(56) References Cited

U.S. PATENT DOCUMENTS

2003/0080836 A1* 5/2003 Nagaishi ............ H01Q 21/0087
257/E23.114
2005/0225481 A1 10/2005 Bonthron
(Continued)

FOREIGN PATENT DOCUMENTS

DE  102016224936 A1  6/2018
DE  102018203106 A1  9/2019
(Continued)

OTHER PUBLICATIONS

Office Action dated Dec. 27, 2023 from corresponding Japanese patent application No. 2023-513781.
(Continued)

*Primary Examiner* — Daniel Munoz

(57) ABSTRACT

A radar system including a circuit board and a molded part having an antenna, wherein the connection between an emitting or receiving element of a high-frequency component and the antenna on an upper side of the molded part is realized by inner waveguides, the emitting or receiving element configured to emit in the direction or receive from the direction of the circuit board, the circuit being permeable by radar waves in the region of the emitting or receiving element, the molded part being arranged on a side of the circuit board opposite the high-frequency component and partially and conductively connected to said circuit board, at least one hollow waveguide is formed by a depression on the side of the molded part facing the circuit board and a metallized surface of the circuit board, and said at least one waveguide is fed from a permeable location of the circuit board.

9 Claims, 5 Drawing Sheets

(51) Int. Cl.
*G01S 13/931* (2020.01)
*H01P 5/107* (2006.01)
*H01Q 1/32* (2006.01)

(56) References Cited

U.S. PATENT DOCUMENTS

| | | |
|---|---|---|
| 2006/0152406 A1 | 7/2006 | Leblanc et al. |
| 2009/0079648 A1* | 3/2009 | Matsuo ............... H01P 5/1007 343/771 |
| 2009/0243948 A1 | 10/2009 | Schmidt |
| 2014/0292606 A1 | 10/2014 | Hayakawa et al. |
| 2019/0129023 A1 | 5/2019 | Lu |
| 2020/0014100 A1 | 1/2020 | Chen et al. |
| 2020/0067167 A1 | 2/2020 | Izadian et al. |
| 2020/0251430 A1 | 8/2020 | Seler |
| 2020/0251817 A1 | 8/2020 | Wang et al. |
| 2020/0400815 A1 | 12/2020 | Wintermantel |

FOREIGN PATENT DOCUMENTS

| | | |
|---|---|---|
| DE | 102018213540 B3 | 1/2020 |
| JP | H07170115 A | 7/1995 |
| JP | 2007248449 A | 9/2007 |
| JP | 2008072559 A | 3/2008 |
| JP | 2012231386 A | 11/2012 |
| JP | 5371997 B2 | 12/2013 |
| JP | 2014197811 A | 10/2014 |
| JP | 2015109570 A | 6/2015 |
| JP | 2015188143 A | 10/2015 |
| JP | 2017161322 A | 9/2017 |
| JP | 7170115 B2 | 11/2022 |
| WO | 2009111839 A1 | 9/2009 |
| WO | 2010026990 A1 | 3/2010 |
| WO | 2018001921 A1 | 1/2018 |
| WO | 2019166064 A1 | 9/2019 |

OTHER PUBLICATIONS

Office Action mailed Jun. 19, 2024 from corresponding Japanese patent application No. 2023-513781.
German Search Report dated Jun. 16, 2021 for the counterpart German Patent Application No. 10 2020 211 254.1.
The International Search Report and the Written Opinion of the International Searching Authority mailed on Nov. 23, 2021 for the counterpart PCT Application No. PCT/DE2021/200111.

* cited by examiner

RADAR SYSTEM FOR DETECTING SURROUNDINGS, COMPRISING A WAVEGUIDE ANTENNA MADE OF A PRINTED CIRCUIT BOARD AND A MOLDED PART

CROSS-REFERENCE TO RELATED APPLICATIONS

The present application is a National Stage Application under 35 U.S.C. § 371 of International Patent Application No. PCT/DE2021/200111 filed on Aug. 16, 2021, and claims priority from German Patent Application No. 10 2020 211 254.1 filed on Sep. 8, 2020, in the German Patent and Trademark Office, the disclosures of which are herein incorporated by reference in their entireties.

BACKGROUND

1. Field

Embodiments of the present application relate to a radar system for detecting the surroundings for motor vehicle applications. According to an aspect of an embodiment, the radar system has a waveguide antenna as well as a high-frequency component with at least one element for direct emission or receipt, wherein the waveguide antenna and the high-frequency component are located on opposite sides of the circuit board and the waveguide antenna is formed from the circuit board and a molded part.

2. Description of Related Art

Motor vehicles are increasingly being equipped with driver assistance systems which detect the surroundings with the aid of sensor systems and deduce automatic reactions of the vehicle and/or instruct, in particular warn, the driver, as a result of the traffic situation thus recognized. A distinction is made between comfort and safety functions.

Full Speed Range Adaptive Cruise Control (FSRA) plays an important role in current development, as a comfort function. The vehicle regulates the ego-speed to the desired speed predefined by the driver, provided the traffic situation permits this; otherwise, the ego-speed is automatically adapted to the traffic situation.

Safety functions now exist in many and diverse forms. One group is made up of functions for reducing the braking or stopping distance in emergency situations right up to autonomous emergency braking. A further group includes lane change functions: they warn the driver or intervene in the steering if the driver would like to perform a dangerous lane change, that is to say if a vehicle is located on the adjacent lane either in the blind spot (this is referred to as BSD—"Blind Spot Detection") or is approaching quickly from behind (LCA—"Lane Change Assist").

However, in the foreseeable future, the driver will no longer only be assisted, but rather the task of the driver will increasingly be dealt with autonomously by the vehicle, i.e., the driver will be increasingly replaced; this phenomenon is known as autonomous driving.

Radar sensors are deployed, including frequently in fusion with sensors using other technologies such as, e.g., camera sensors, for systems of the type described above. The advantage of radar sensors is that, among other things, they work reliably, even in poor weather conditions, and, in addition to the distance of objects, they can also directly measure the radial relative speed thereof by way of the Doppler effect. As a general rule, 24 GHz, 77 GHz and 79 GHz are deployed as transmitting frequencies.

Due to the increasing functional scope of such systems, the requirements, in particular in terms of the maximum detection range, are constantly increasing. Nevertheless, a considerable price drop is simultaneously taking place.

In addition to detecting the environment of motor vehicles for systems of the type described above, the focus is now also turning towards monitoring the interior of motor vehicles, e.g., in order to recognize which seats are occupied; frequencies in the range of 60 GHz are deployed. The radar sensors used for this must be particularly inexpensive in order to be able to compete with other interior monitoring technologies.

A central element of each radar sensor is the antenna; it is key in defining the performance and the price of the sensor. Currently, the antennas are mostly realized in planar technology on the high-frequency circuit board, e.g., as patch antennas. The disadvantages of such an antenna realization are, on the one hand, the losses in the feed cables and antennas themselves (which limits the range) and, on the other hand, the high costs of such a circuit board (in particular because special high frequency-capable substrates are required, which are expensive and require elaborate processing).

A basic construction of a generic radar sensor is known from DE 102018203106 A1, which overcomes the disadvantages of planar technology in that a waveguide antenna made of plastic and a high-frequency component with at least one element for direct emission or receipt is deployed, wherein the waveguide antenna and the high-frequency component are located on opposite sides of the circuit board and the high-frequency component and the waveguide antenna are coupled through the circuit board, e.g., by way of a simple hole in the circuit board. It is not described how the waveguide antenna and the PCB can be simply and robustly connected to one another in DE 102018203106 A1. In addition, the antenna shown there by way of example has inner waveguide channels, i.e., it must be composed of at least two layers.

Proceeding from the prior art (e.g., for the general concept from DE 102018203106 A1), the problem of the embodiment is to propose a construction which is simple, robust and inexpensive to realize.

SUMMARY

According to an aspect of an embodiment, there is provided a radar system having improved performance, lower price and reduced size achieved in a robust and simple manner.

According to an aspect of an embodiment, the radar system for detecting the surroundings includes a circuit board which includes at least one high-frequency component with at least one element for direct emission or receipt, and a molded part which has one or more individual antennas for transmitting and/or receiving radar signals on its upper side, wherein the connection between the at least one emitting or receiving element of the high-frequency component and the at least one individual antenna on the upper side of the molded part is realized at least partially by inner waveguides.

According to an aspect of an embodiment, the at least one emitting or receiving element of the high-frequency component is configured in such a way that it emits in the direction of the circuit board or receives from the direction of the circuit board, the circuit board is permeable by radar waves in the region of the at least one emitting or receiving element, the molded part is arranged on the side of the circuit board opposite the at least one high-frequency component and is at least partially and conductively connected to said circuit board in particular by soldering and/or conductive bonding, at least one hollow waveguide is formed by a depression on the side of the molded part facing the circuit board and a metallized surface of the circuit board, said at least one waveguide is fed from a permeable location of the circuit board, and due to this construction, the molded part can consist of or consists of an at least partially metallized single-layer plastic part.

The molded part and the circuit board can already be expediently pressed together during the process of the soldering (soldering process) and/or of the bonding (adhesion process).

The pressing together is preferably realized by temporarily attached spring elements such as, e.g., clamps and/or spring pins.

Alternatively, the pressing together can also be realized by resilient elements integrated into the molded part, which are connected to the circuit board preferably by being pressed in or by clips.

The molded part can further have nominal bending points, by means of which it is arranged on or pressed onto the circuit board.

Solder beads are preferably arranged on the side of the molded part facing the circuit board, which are used for soldering and are part of the waveguide boundary.

The positioning of the molded part parallel to the circuit board can be expediently realized by structures such as, for example, plugs and pins, which protrude from the molded part into recesses or holes in the circuit board.

According to an aspect of an embodiment, the at least one location permeable by radar waves in the circuit board is configured by a hole in the circuit board having metallized side walls.

The at least one location permeable by radar waves in the circuit board can be realized in that no metallization is located there on and/or between carrier material layers of the circuit board and the location is edged with vias or surrounded by these.

Solder beads are preferably arranged around the at least one emitting or receiving element on the lower side of the at least one high-frequency component in such a way that a lateral escaping of the radiation in an intermediate space of the high-frequency component and the circuit board is reduced or prevented, in particular in order to avoid a coupling between multiple transitions.

The radar system can expediently comprise a good heat conducting component part, in particular a lid made, for example, of metal, wherein the component part is arranged on the same side of the circuit board as the at least one high-frequency component. A thermal contact can additionally be produced, in particular by means of thermal heatsink paste, between the high-frequency component and the component part.

According to an aspect of an embodiment, at least one component can be arranged on the side of the circuit board facing the molded part, wherein the component is covered by a cavity in the molded part, the surface of which is preferably metallized.

According to an aspect of an embodiment, there is provided a method for producing a radar system, in which the molded part and the circuit board are pressed together during the soldering (soldering process) and/or bonding (adhesion process).

The pressing together of the molded part and the circuit board is preferably realized by temporarily attached spring elements, such as, e.g., clamps and/or spring pins, or by resilient elements integrated into the molded part, which are connected to the circuit board preferably by being pressed in or by clips.

The fact that nominal bending points, for example in the form of grooves, apertures and/or webs, are provided means that the molded part can be pressed onto the circuit board in a particularly simple manner.

BRIEF DESCRIPTION OF THE DRAWINGS

A spring element integrated into the molded part for pressing together the molded part and the circuit board is depicted in FIG. 8.

DETAILED DESCRIPTION OF THE EMBODIMENTS

Figure 1:
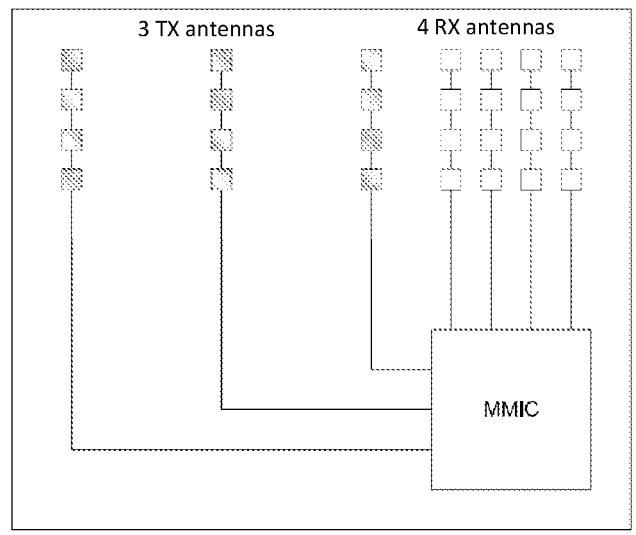
FIG. 1 shows a high-frequency circuit board of a radar system according to the prior art.

Today, antennas for radar systems for detecting the environment are mostly realized as planar antennas on a high-frequency circuit board. A high-frequency circuit board having a high-frequency component, a so-called MMIC (Monolithic Microwave Integrated Circuit) and having 3 transmitting antennas (TX) as well as 4 receiving antennas (RX) is shown in FIG. 1, wherein the antennas are in each case composed of multiple individual radiators. The antennas are realized as planar patch antennas.

The antennas and their feed cables from the high-frequency chip require a special substrate with material data suitable for high frequency (e.g., defined thickness, defined dielectric constant, very low loss angle) on the upper layer of the high-frequency circuit board. In particular, the material costs of said special substrate and its processing (including due to the necessary high structural accuracies) lead to costs increased by factors, compared to a pure low-frequency circuit board of a similar size and a similar number of layers. However, in addition to the costs, the signal losses in the antennas and their feed cables are also disadvantageous. For a transmitting and a receiving antenna including feed cables, power losses of approximately 6 dB are typical. Such a reduced sensor sensitivity results in a maximum sensor range which is reduced by 30%.

Figure 2:
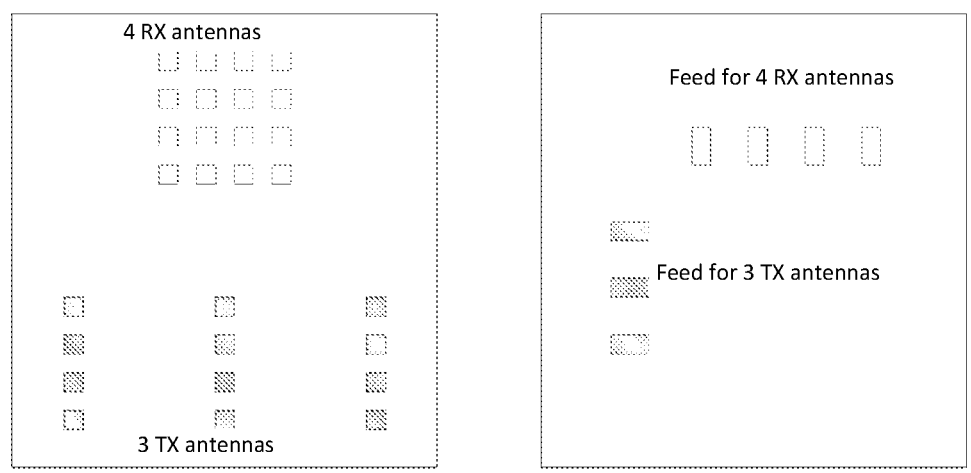
FIG. 2 shows the upper side (on the left) and the lower side (on the right) of a cuboid plastic-based waveguide antenna.

Due to the indicated disadvantages of circuit board-based antennas, so-called waveguide antennas are now increasingly being considered. Here, antennas and their feed cables are realized with the aid of waveguides which, in the simplest case, constitute rectangular hollow spaces having metal or metallized walls; therefore, the designation waveguide antenna is frequently also used. Such an antenna can be embodied as a cuboid plastic part and is, for example, depicted in FIG. 2. As shown in FIG. 2, there are openings for emission on the upper side and openings for feeding on the lower side; hollow space structures run inside the plastic part, wherein all of the surfaces are metallized on the outside and inside (only the surfaces in the region of the waveguides and the individual antennas would have to be metallized for the actual functionality, but for the purposes of simplifying manufacture, the entire surface is most commonly metallized); depressions on the lower side of the antenna for structural elements (in particular the high-frequency chip) located on the circuit board underneath and high-frequency cables to structures emitting into the waveguide antenna are not depicted in FIG. 2. Such an antenna is typically composed of at least two metallized layers in order to be able to realize inner waveguides; if three or more layers are used, a crossing of high-frequency connections is also possible. Since the arrangement of the individual antennas is now independent of the chip, as depicted in FIG. 2, the 3 transmitting antennas can be arranged, e.g., beneath the 4 receiving antennas (in the case of the circuit board-based antenna according to FIG. 1, they are arranged next to one another). Since the chip now no longer lies on the antenna plane, smaller sensors can be realized.

In addition to injection molding, 3D printing is now also considered as a production method for plastic antennas. Waveguide antennas produced from plastic, which is metallized on the surface, have considerable production and cost advantages compared with a solid metal realization. Challenges in the case of plastic-based waveguide antennas include the necessary accuracy of the structures and the precisely fitting connection of the multiple plastic layers—however, new production methods are now making this possible.

Figure 3:
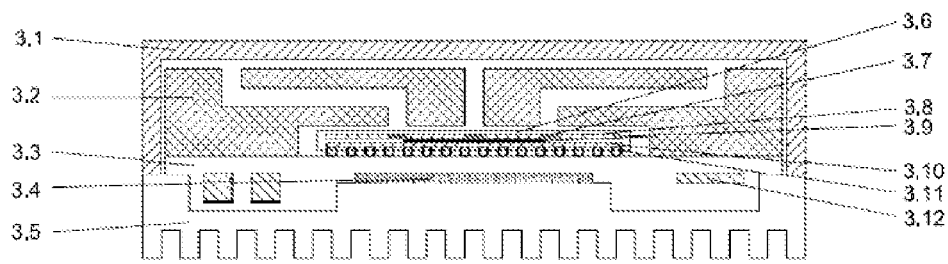
FIG. 3 shows a section through a radar sensor with direct emission from an upper side of a high-frequency chip into a waveguide antenna.

However, even when using plastic antennas, there are still high-frequency signals on the circuit board nowadays, in particular in each case from the chip output up to a structure emitting into the waveguide antenna. Due to this, relatively expensive and elaborate circuit boards are also deployed here. For this reason, efforts are being made to emit directly from the upper side of the high-frequency chip into the waveguide antenna, as depicted in FIG. 3. Admittedly, this approach does have some disadvantages: the transition from the chip 3.6 into the waveguide antenna 3.2 is tolerance-critical; the long tolerance chain includes, in particular, the following: soldering of the chip, thickness of the chip, tolerances of the antenna; direct contact of the antenna with the chip (both during manufacture and over the lifetime), as a result of which the chip can be damaged; chip 3.6 requires, in addition to the silicon core 3.9 which contains high-frequency, low-frequency and digital circuits, not only a so-called redistribution layer 3.10 at the bottom, but also a further redistribution layer 3.8 for the emission elements 3.7 at the top; the thermal dissipation of the chip is unsatisfactory, since the plastic antenna 3.2 and the front plastic housing 3.1 thermally isolate, so that heat from the chip can almost exclusively only be dissipated by way of the circuit board 3.3; the thermal coupling of the chip to the metal back of the sensor 3.5 by way of the thermal heatsink paste 3.4 is therefore not possible directly, but only possible through the circuit board.

Figure 4:
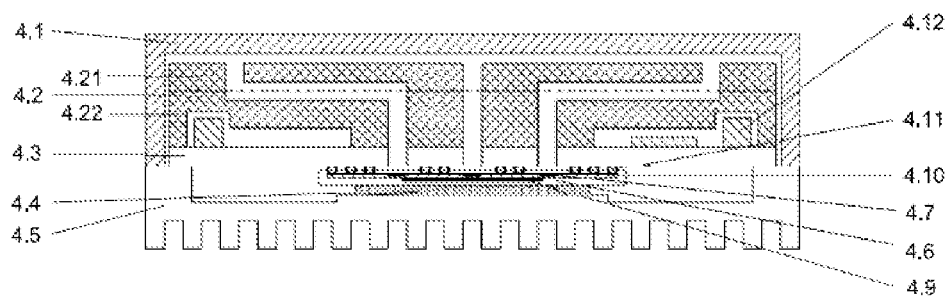
FIG. 4 shows a section through a radar sensor with direct emission from a lower side of a high-frequency chip through openings in a circuit board into a waveguide antenna which is located on the opposite side of the circuit board.

In order to circumvent said disadvantages, the general construction according to FIG. 4 has already been proposed in DE 102018203106 A1. The emitting elements 4.7 are now arranged on the lower side of the chip 4.6, wherein the chip 4.6 is located on the side of the circuit board 4.3 opposite the plastic antenna 4.2. From the chip 4.6, the plastic antenna 4.2 is fed through the circuit board 4.3 which is permeable by the radar waves at said locations; that is to say, high-frequency transitions from the chip 4.6 into the plastic antenna 4.2 are realized through the circuit board 4.3.

As depicted in FIG. 4, the permeability of the circuit board 4.3 can in each case be simply realized by a hole in the circuit board 4.3, wherein the side walls of the circuit board 4.3 are then metallized at this location such that a type of waveguide is realized in each case.

Another approach for permeable transitions in the circuit board, which is proposed in DE 102018203106 A1, consists of omitting the metallizations there on or between the carrier material layers of the circuit board and edging said regions with vias.

In order to prevent radiation in the intermediate space of the high-frequency component and the circuit board escaping at the transitions, which would, on the one hand, lead to a loss in performance and, on the other hand, to coupling between the transitions, solder beads (balls) can be placed around the transitions and, therefore, between the transitions. This is depicted, for example, in FIG. 4 where a chip 4.6 embodied as a so-called ball grid array having balls 4.11 is shown. When said solder beads 4.11 are designed and arranged in a suitable manner, they can constitute a band-rejection filter for the high frequency used and, consequently, act as an EBG (Electromagnetic Band-Gap) structure.

A further advantage of the arrangement according to FIG. 4 is that it allows a good thermal contacting of the chip 4.6 which has a high current consumption and, therefore, self-heating. To this end, the chip 4.6—as depicted—is thermally coupled by way of thermal heatsink paste 4.4 to the cover 4.5 on the back of the sensor, which cover 4.5 can at least partially consist of aluminum and can have cooling fins.

As additionally depicted in FIG. 4, components 4.12 can be fitted on the side of the circuit board 4.3 facing the plastic antenna 4.2, which components are covered by cavities in the plastic antenna 4.2. Since the surface of the plastic antenna 4.2 is metallized anyway, an electrical shielding of components can be realized without additional costs.

It is not explained in DE 102018203106 A1 how the plastic antenna is connected to the circuit board. In particular, it is important that there is no air gap or only a very small air gap (<50 µm in the case of a 77/79 GHz radar system) between the antenna 4.2 and the circuit board 4.3 in the region of the feeds, since it otherwise leads, e.g., to the strong coupling of the various antenna channels and, therefore, to poor angle formation and/or reduced sensor sensitivity. In addition, the antenna shown by way of example in DE 102018203106 A1 has inner waveguide channels, i.e., it must be composed of at least two layers—in the antenna according to FIG. 4, the two layers are denoted by 4.21 and

4.22. In order to solve or improve these two points, the following realization according to the embodiment is proposed.

Figure 5:
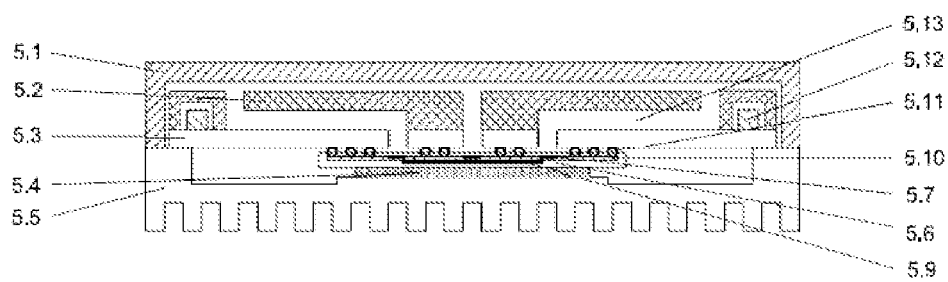
FIG. 5 shows a section through the radar sensor according to the embodiment with direct emission from a lower side of a high-frequency chip through openings in a circuit board into a waveguide antenna which is located on the opposite side of the circuit board and which is formed by a single-layer molded part and the at least partially metallized circuit board surface itself, wherein the molded part and the circuit board are at least partially conductively connected by soldering or adhesion.

FIG. 5 shows a waveguide antenna which is realized by soldering or conductively adhering a single-layer molded part 5.2, which is metal or at least partially metallized on the surface, to the circuit board 5.3. Therefore, three sides of inner waveguides 5.13 are realized by the molded part, while the fourth side is realized by the circuit board which is metallized on the surface there. Roughly speaking, the lower antenna layer 4.22 from FIG. 4 is now replaced by the circuit board 5.3; of course, the groove for the waveguide in the molded part 5.2 must now have the full depth of the waveguide. The advantage is that only a single-layer molded part is required, while the antenna according to FIG. 4 only needed two molded parts; this leads to a significant price reduction and to a reduced size. The connection process used, that is to say, soldering or bonding, is likewise inexpensive; in the simplest case, the molded part and the electronic components are soldered on in the same process, so that no additional process step is necessary.

Figure 6:
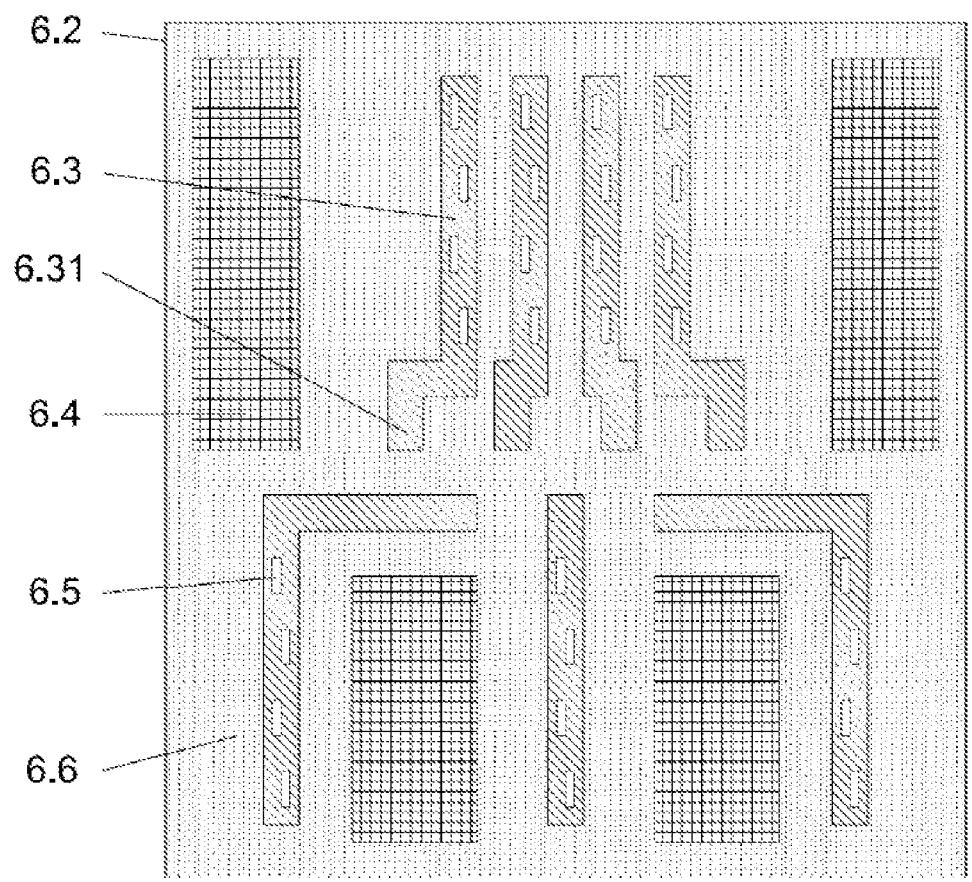
In FIG. 6, the molded part is depicted from its side facing the circuit board.

While FIG. 5 only illustrates the structure of the molded part and, in particular, its forward-emitting elements in a very simplified and schematic manner, FIG. 6 shows the structure of the molded part 6.2 in greater detail, viewed from the back. The hatched areas are depressions for waveguides 6.3 (obliquely hatched) and component cavities 6.4 (hatched with a checked pattern). The slots 6.5 marked in white are apertures to the upper side which, for its part, is otherwise unstructured. The dotted area 6.6 constitutes the otherwise smooth back of the molded part. The feed from the high-frequency component through the circuit board takes place at the start 6.31 of the waveguides. In the region of the feed, the structure in the molded part can also be more complex in order to achieve a better adaptation. In addition to the slots 6.5 shown, other structures such as, e.g., horn radiators can also be realized towards the upper side for decoupling from the antenna.

The conductive connection between the molded part 6.2 and the circuit board underneath should exist around the waveguide structures 6.3. Instead of a connection over the entire surface, individual points (at a distance of typically <1 mm in the case of a 77/79 GHz radar system) are also sufficient. One possible embodiment is that the molded part is equipped like a chip with solder beads (balls) on the lower side and is soldered to the circuit board by way of said solder beads.

It is advantageous for the soldering or bonding if the molded part is as flat as possible on the back (of course, only in the non-depressed regions). If the molded part is produced from plastic using the injection molding process, thermoplastics as the base material are the simplest and most inexpensive solution in manufacturing terms—admittedly, the dimensional stability and, therefore, flatness as well as their thermal expansion behavior which can be realized with thermoplastics are, in general, not optimal. In addition, thermoplastics are not particularly heat-resistant either, which can lead to a low-temperature soldering process being required when the molded part is soldered onto the circuit board and, therefore, the soldering cannot take place in the same process step as the electronic components (e.g., the chip), i.e., two separate soldering processes are then required.

These disadvantages can be avoided by using thermoplastics as the plastic base material; they provide dimensionally stable and heat-resistant injection molded parts which also have a very smooth surface, which is important for waveguides which are as low-loss as possible (no thick metallization layers are then required to "smooth" the surfaces either, but rather thin metallizations are sufficient, resulting in cost savings). The disadvantage of molded parts made of thermoplastics is that the production thereof is, in general, rather more elaborate.

In addition to plastic molded parts produced by injection molding, the surface of which is metallized, other production processes and materials can also be utilized; e.g., production with 3D printing and/or use of metal base materials (for example, die-cast aluminum, if necessary, with subsequent finishing of the surface).

If the molded part used is dimensionally stable, it can be soldered or bonded to the circuit board without being pressed on. In order to avoid a lateral, that is to say, parallel displacement of the molded part with respect to the circuit board (that is to say, to guarantee a sufficiently precise lateral positioning), it is advantageous if there are projecting plugs or pins on the lower side of the molded part, which protrude into corresponding holes in the circuit board.

In the case of molded parts which are less dimensionally stable, it can be necessary to press the antenna onto the circuit board during the soldering or adhesion process, so that a sufficiently good soldering around the waveguide structures 6.3 is achieved. This can be done by squeezing the latter together by way of stamps from above and below.

Figure 7:
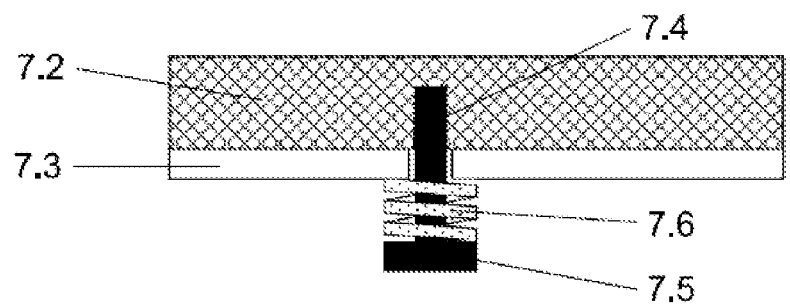
FIG. 7 shows a temporary connection of the molded part and the circuit board during the soldering or adhesion process by a spring pin.

Alternatively, this can be achieved in that, prior to the soldering or adhesion process, one or more resilient elements are attached for pressing the molded part and the antenna together and these are then removed again following the soldering or adhesion process; in addition to clamps, pins having a spring element can also be deployed, which are squeezed in from behind through a hole in the circuit board into a press-fit structure of the molded part, wherein a resilient element exerts a force on the circuit board from behind—one exemplary embodiment is depicted in FIG. 7, wherein the resilient element there consists of a normal spring 7.6 which squeezes on the one side against the head 7.5 of the pin 7.4 pressed into the molded part 7.2 and on the other side against the circuit board 7.3 so that the circuit board and the molded part are squeezed together (only a detail of the entire arrangement is depicted in FIG. 7).

Figure 8:
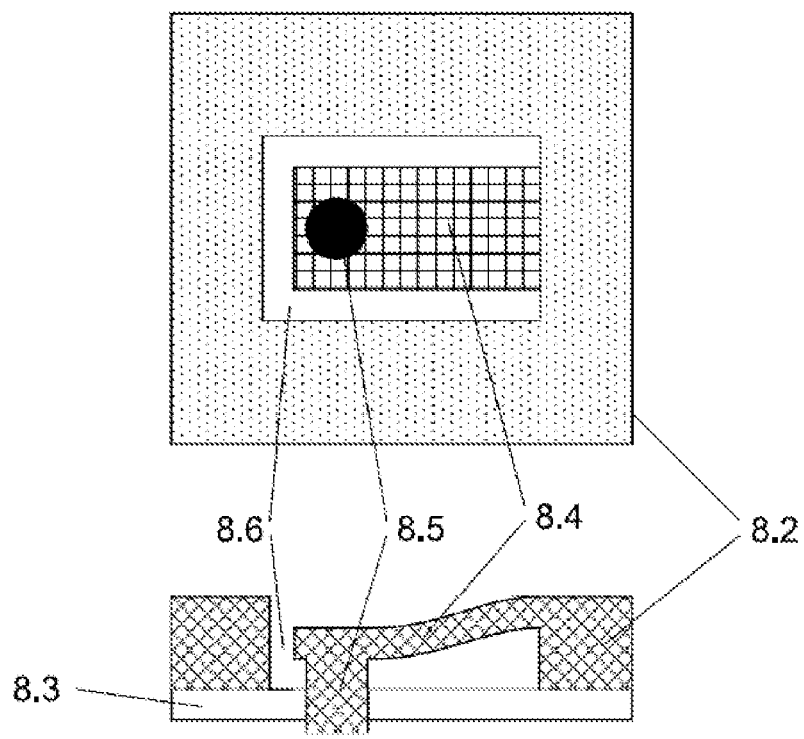

Instead of attaching separate resilient elements temporarily for the soldering or adhesion process, said resilient elements can also be realized as an element of the molded part itself. FIG. 8 shows an example of this—a detail of the molded part 8.2 made of metallized plastic is depicted from behind at the top, a section through the molded part 8.2 and the circuit board 8.3 in the pressed-together condition is depicted at the bottom. The structure 8.4 realized by a cavity breached on three sides includes a plug 8.5 protruding backwards, which is pressed into a hole in the circuit board 8.3; the spring effect is attained by the structure 8.4 which is cut free on three sides and the use of an elastic plastic (e.g., made of thermoplastic); the apertures for cutting the structure 8.4 free are denoted by 8.6.

Figure 9:
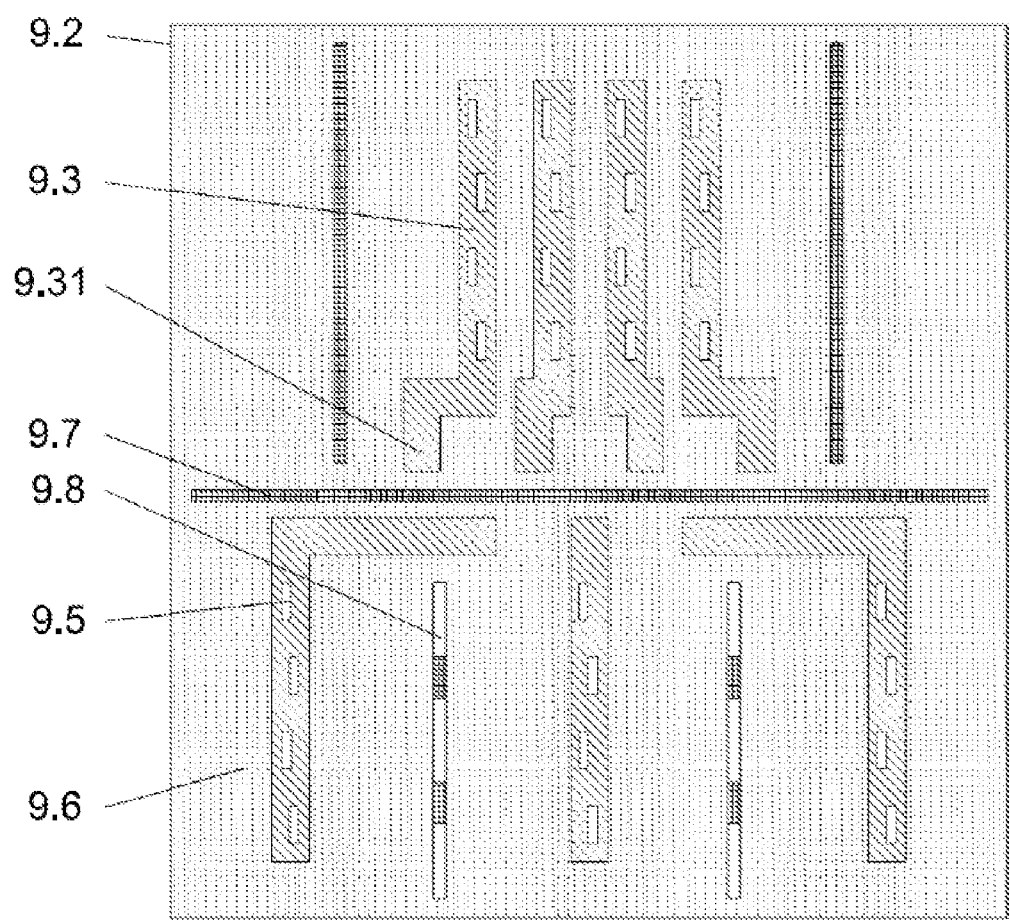
FIG. 9 shows a molded part with nominal bending points in order to facilitate a pressing together of the molded part and the circuit board.

The pressing together is facilitated if the molded part is as elastic as possible, which can be attained by nominal bending points as proposed in DE 1 0201 821 3540 B3. As depicted by way of example in FIG. 9, the molded part can, to this end, have deep grooves 9.7 and/or apertures 9.8, so that thin, elastic connections or webs are realized between individual regions of the molded part; grooves can be realized from the back and/or front.

In the case of molded parts made of plastic, it can be advantageous in terms of the metallization process if the depressions for the waveguides are not simultaneously narrow and deep. In the simplest case, waveguides are rectangular; it is therefore favorable if the wide side of the waveguide lies parallel to the back and the narrow side constitutes or defines the depression. However, in the region of the coupling-in from the chip through the hole in the circuit board, it is possible that there will not be enough space for such an orientation of a rectangular waveguide, if the coupling-in locations are located close to one another (as a consequence of a chip which is as small as possible). Space-saving transition structures are then required.

Small and shallow waveguides can also be realized in that their cross-section is not rectangular, but rather has a longitudinal raised web, e.g., in the middle of one of the long sides; in technical jargon, this is referred to as a "ridged waveguide".

To date, single-layer molded parts have been considered, since these constitute the most inexpensive variant. For complex antennas which need, e.g., a crossing of waveguides, at least one further layer is required. Said at least one further layer is preferably produced as a further molded part using the same manufacturing process as the first molded part, and the connection of said at least one further molded part to the first molded part is realized in the same process step (in particular by soldering or conductive bonding) as the connection between the first molded part and the circuit board.

Finally, the following should be noted:
A radar system both transmits and receives. To simplify matters, both are frequently not explicitly stated or distinguished in the above description. E.g., "radiation/emission" is referred to in the case of the antenna or the elements on the chip—in the case of receiving antennas, this of course means "receiving"; and if "feeding" is referred to in the case of the waveguide on the back of the antenna, this then means "decoupling" in the case of receiving antennas.

The invention claimed is:

1. A radar system comprising:
   a circuit board having at least one high-frequency component with at least one element for signal transmission and reception;
   a molded part; and
   at least one antenna for transmitting and receiving radar signals disposed on an upper side of the molded part,
   wherein a connection between the at least one element for signal transmission and reception and the at least one antenna is realized by inner waveguides,
   wherein the at least one element for signal transmission and reception is configured to emit signals in a direction of the circuit board or receive signals from the direction of the circuit board,
   wherein the circuit board is permeable by radar waves in a region of the at least one emitting or receiving element,
   wherein the molded part is arranged on the side of the circuit board opposite the at least one high-frequency component and is conductively connected to the circuit board,
   wherein at least one hollow waveguide is formed by a depression on the side of the molded part facing the circuit board and a metallized surface of the circuit board,
   wherein the at least one waveguide is fed from a permeable location of the circuit board, and
   wherein the molded part consists of a metallized single-layer plastic part.

2. The radar system according to claim 1, wherein the molded part and the circuit board are disposed against each other.

3. The radar system according to claim 2, wherein the molded part has nominal bending points in the form of grooves, apertures and/or webs.

4. The radar system according to claim 3, further comprising solder beads located on the side of the molded part facing the circuit board.

5. The radar system according to claim 1, wherein the at least one location permeable by radar waves in the circuit board comprises a hole in the circuit board having metallized side walls.

6. The radar system according to claim 1, wherein the at least one location permeable by radar waves in the circuit board comprises a portion of the circuit board at which no metallization is located, no metallization is located between carrier material layers of the circuit board, and the location is edged with vias.

7. The radar system according to claim 1, further comprising solder beads arranged around the at least one emitting or receiving element on the lower side of the at least one high-frequency component in such a way that a lateral escaping of the radiation in an intermediate space of the high-frequency component and the circuit board is reduced or prevented.

8. The radar system according to claim 1, further comprising a heat conducting component part, wherein the heat conducting component part is arranged on the same side of the circuit board as the at least one high-frequency component, and a thermal contact is provided between the high-frequency component and the heat conducting component part.

9. The radar system according to claim 1, wherein at least one component is arranged on the side of the circuit board facing the molded part, and wherein the component is covered by a cavity in the molded part, the surface of which is metallized.

* * * * *